US011516944B1

(12) United States Patent
Gao

(10) Patent No.: US 11,516,944 B1
(45) Date of Patent: Nov. 29, 2022

(54) SERVER RACK COOLING SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/393,076

(22) Filed: Aug. 3, 2021

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ......... *H05K 7/208* (2013.01); *H05K 7/20318* (2013.01); *H05K 7/20327* (2013.01)

(58) Field of Classification Search
CPC .............. H05K 7/208; H05K 7/20318; H05K 7/20327; H05K 7/20809; H05K 7/20818; H05K 7/2029; H05K 7/20336
See application file for complete search history.

(56) References Cited

U.S. PATENT DOCUMENTS

| 9,351,429 | B2 * | 5/2016 | Shelnutt | H05K 7/203 |
| 10,925,188 | B1 * | 2/2021 | Keehn | H05K 7/20754 |
| 2011/0315353 | A1 * | 12/2011 | Campbell | H05K 7/20809 165/104.31 |
| 2011/0317367 | A1 * | 12/2011 | Campbell | H05K 7/203 361/700 |
| 2014/0124174 | A1 * | 5/2014 | Campbell | H05K 7/20809 29/890.035 |
| 2014/0218859 | A1 * | 8/2014 | Shelnutt | H05K 7/20809 361/679.46 |
| 2016/0330879 | A1 * | 11/2016 | Andre | B29C 70/885 |
| 2017/0064862 | A1 * | 3/2017 | Miyoshi | H01L 23/32 |
| 2020/0236808 | A1 * | 7/2020 | Smith | H05K 7/20818 |
| 2020/0404805 | A1 * | 12/2020 | Gao | H05K 7/20781 |
| 2022/0007548 | A1 * | 1/2022 | Lee | H05K 7/203 |

\* cited by examiner

*Primary Examiner* — Anthony M Haughton
(74) *Attorney, Agent, or Firm* — Womble Bond Dickinson (US) LLP

(57) ABSTRACT

An electronic rack includes a condensing unit to be coupled to a first distribution manifold to circulate single-phase cooling fluid received from a first cooling fluid source. The electronic rack further includes a server chassis unit positioned underneath the condensing unit, and the server chassis unit is coupled to a second distribution manifold to receive two-phase cooling fluid from a second cooling fluid source. The second distribution manifold fills the server chassis which contains one or more electronic devices to at least partially submerged the electronics devices in the two-phase cooling fluid, wherein the two-phase cooling fluid is to extract heat from the electronic devices and to evaporate into vapor upwardly into the condensing unit, and wherein the condensing unit is to condense the vapor into a fluid phase and to return the fluid downwardly back into the server chassis unit.

20 Claims, 8 Drawing Sheets

SERVER RACK COOLING SYSTEM

FIELD OF THE INVENTION

Embodiments of the present invention relate generally to the data center, server rack, cooling system, two-phase immersion system. More particularly, embodiments of the invention relate to a cooling system for server racks.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Immersion cooling technology has brought many attentions recently. Many efforts are focusing on the fluid selection, information technology (IT) side design, material compatibilities, test and verification, and so on. The packaging design for the servers and racks with immersion cooling is also critical, especially for deploying the solutions in scale.

The conventional for two-phase immersion cooling is designed based on a full-container based solution. The pitfall of this solution is that it requires a holistic change of the entire infrastructure change to deploy. In addition, the flexibility of the conventional solution is low. The present disclosure proposes an advanced architecture for designing and implementing the server in a two-phase immersed environment. In addition, this solution does not require major changes from a rack design to a facility system. It can be flexibility implemented for different application scenarios.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1A:
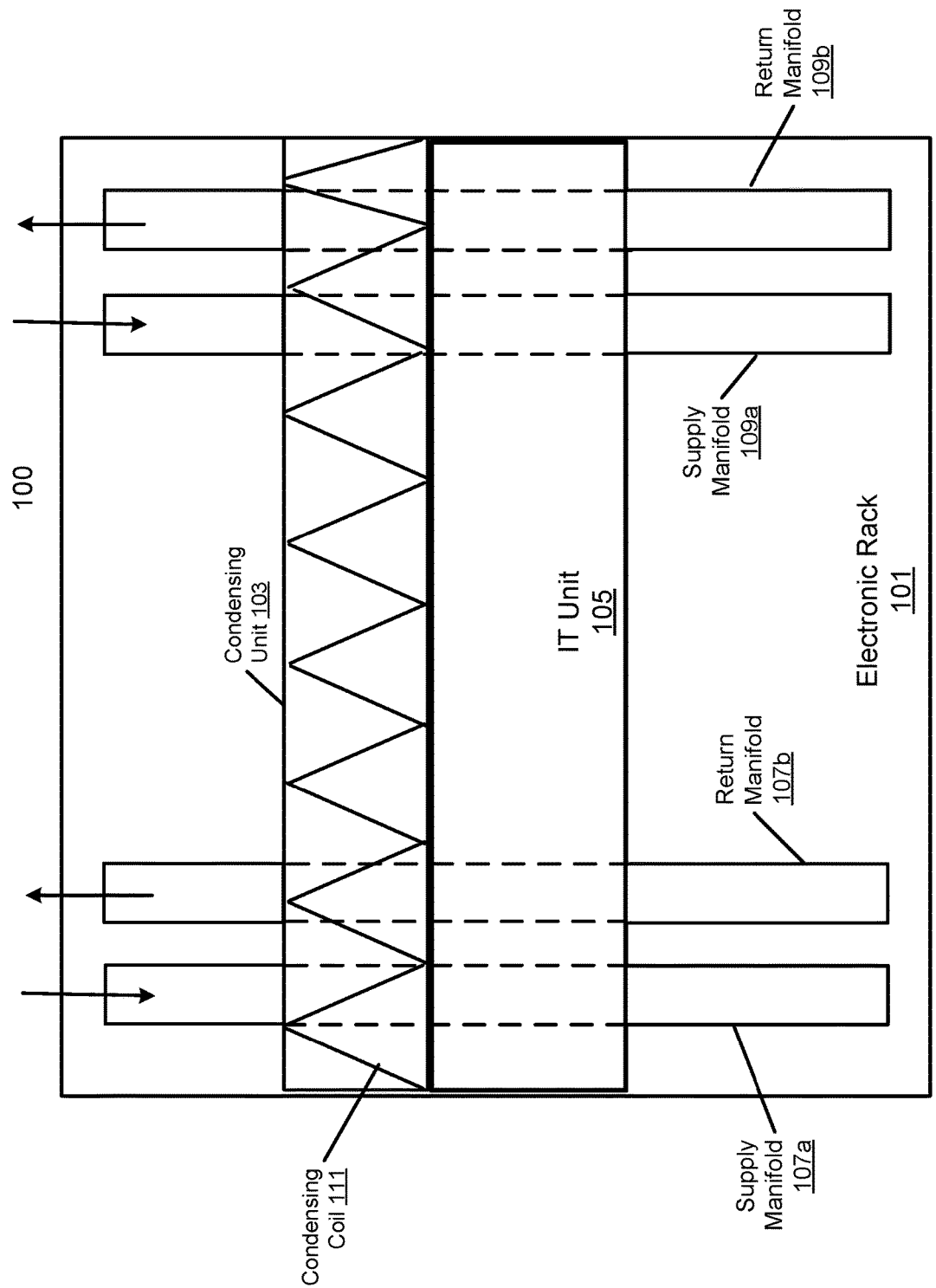
FIG. 1A shows a front view of a rack level system design according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures.

The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architectures.

The present disclosure aims to provide an advanced rack architecture for server and IT equipment in an immerged environment that can be cooled using the two-phase fluid. This design is used for developing and building server, rack and facility two-phase systems. In addition, the following items serve as additional challenges that the current work aims to solve: high power density, especially the high power artificial intelligence (AI) devices and chips; high efficiency operation; highly reliable system design, rack, and server co-design; low cost, a decreased need for modification on existing facility infrastructure; technology that enables phase changes, two-phase systems; ease of operations, on both the IT side and cooling unit side; and ease of service and maintenance.

In addition, the present disclosure aims to design a self-regulating system for phase change systems that will have better performance and easy control design. The self-regulating design enables a cost effective control and efficient fluid management and operation for different use cases.

The present application includes a modular condensing unit. In an embodiment, one or more modular condensing units are installed. For example, the condensing units are connected to the cooling fluid source and the distribution manifold. In an embodiment, cooling coils are included within the condensing unit where the cooling fluid are running through. The server IT is designed in a sealed container, and servers and electronics are in the immerged environment. The IT container is populated without any coolant and is later filled with coolant once populated to the rack through the two-phase distribution source. During operations, the IT unit and the condensing unit form a two-phase cycle. The two-phase distribution source is used for pumping the two-phase coolant out if the server needs to be depopulated from the rack.

According to one aspect, an electronic rack includes a condensing unit to be coupled to a first distribution manifold to circulate single-phase cooling fluid received from a first cooling fluid source. For example, the single-phase cooling fluid is designed to not directly in contact with the electronics. In an embodiment, the single-phase cooling fluid is cooling water.

The electronic rack further includes a server chassis unit positioned underneath the condensing unit. In an embodiment, the server chassis unit is coupled to a second distribution manifold to receive two-phase cooling fluid from a second cooling fluid source to fill the server chassis unit (e.g., a container). In an embodiment, the server chassis unit is to contain one or more electronic devices that are at least partially submerged in the two-phase cooling fluid within the server chassis unit. In an embodiment, the two-phase cooling fluid is to extract heat from the electronic devices and to evaporate into vapor upwardly into the condensing unit, and the condensing unit is to condense the vapor into a fluid form and to return the two-phase cooling fluid downwardly back into the server chassis unit.

In an embodiment, the condensing unit is connected with the first distribution manifold via a pair of single-phase connectors to receive and to return the single-phase cooling fluid from and to the first cooling fluid source, wherein the first cooling fluid source is a single-phase distribution source. The first distribution manifold includes a first supply manifold and a first return manifold configured to receive and return the single-phase cooling fluid from the first cooling fluid source. The first supply manifold is connected to a circulation pump configured to pump the single-phase cooling fluid from the first cooling fluid source to the condensing unit. In an embodiment, the circulation pump can be connected to the return manifold.

In an embodiment, the electronic rack includes one or more servers and one or more condensing units. For example, each condensing unit includes a plurality of cooling coils, wherein the single-phase cooling fluid is flowing through the plurality of cooling coils.

In an embodiment, the condensing unit is packaged in a condensing chassis to form a contained environment wherein the one or more servers are populated underneath the condensing chassis. In an embodiment, the condensing chassis includes one or more connectors only connected to the first cooling fluid source. In an embodiment, the condensing unit is configured to be able to populate and depopulate from the electronic rack.

In an embodiment, the condensing unit includes one or more cooling coils, wherein the single-phase cooling fluid is flowing through the plurality of cooling coils. The condensing unit is to condense the vapor into the fluid phase through condensation around the plurality of cooling coils.

In an embodiment, the condensing unit is only connected to the first cooling fluid source. The connection of the condensing unit with the cooling fluid source hardware are through blind mating connectors. The condensing unit is configured to be able to populate and depopulate from the electronic rack.

In an embodiment, the server chassis unit is coupled to a second cooling fluid, and wherein the second cooling fluid source is a two-phase distribution source. The server chassis unit is connected with the second distribution manifold via a pair of two-phase connectors to receive and to return the two-phase cooling fluid from and to the second cooling fluid source.

In an embodiment, the second distribution manifold includes a second supply manifold and a second return manifold to receive and return the two-phase cooling fluid from the second cooling fluid source. The second supply manifold is connected to a charging pump configured to initially charge of the two-phase cooling fluid from the second cooling fluid source to fill the server chassis unit.

In an embodiment, the second return manifold is connected to a draining pump configured to pump out the two-phase cooling fluid from the server chassis unit. In an embodiment, the charging pump and the draining pump are configured to operate in an asynchronous manner. In an embodiment, the server chassis unit and the condensing unit are configured to form a sealed region.

In an embodiment, the second supply manifold and the second return manifold are inactive during normal operations. The first supply manifold and the first return manifold are active during normal operations. The server chassis unit is configured to be able to populate and depopulate from the electronic rack.

According to another aspect, a data center cooling system includes a fluid supply line coupled to receive cooling fluid from a cooling fluid source, a fluid return line coupled to return the cooling fluid to the cooling fluid source, and a plurality of electronic racks coupled to the fluid supply line and the fluid return line.

In an embodiment, each of the electronic racks includes a condensing unit to be coupled to a first distribution manifold to circulate single-phase cooling fluid received from a first cooling fluid source. The electronic rack further includes a server chassis unit positioned underneath the condensing unit. In an embodiment, the server chassis unit is coupled to a second distribution manifold to receive two-phase cooling fluid from a second cooling fluid source to fill the server chassis unit. In an embodiment, the server chassis unit is to contain one or more electronic devices that are at least partially submerged in the two-phase cooling fluid within the server chassis unit. In an embodiment, the two-phase cooling fluid is to extract heat from the electronic devices and to evaporate into vapor upwardly into the condensing unit, and the condensing unit is to condense the vapor into a fluid form and to return the two-phase cooling fluid downwardly back into the server chassis unit.

Figure 1B:
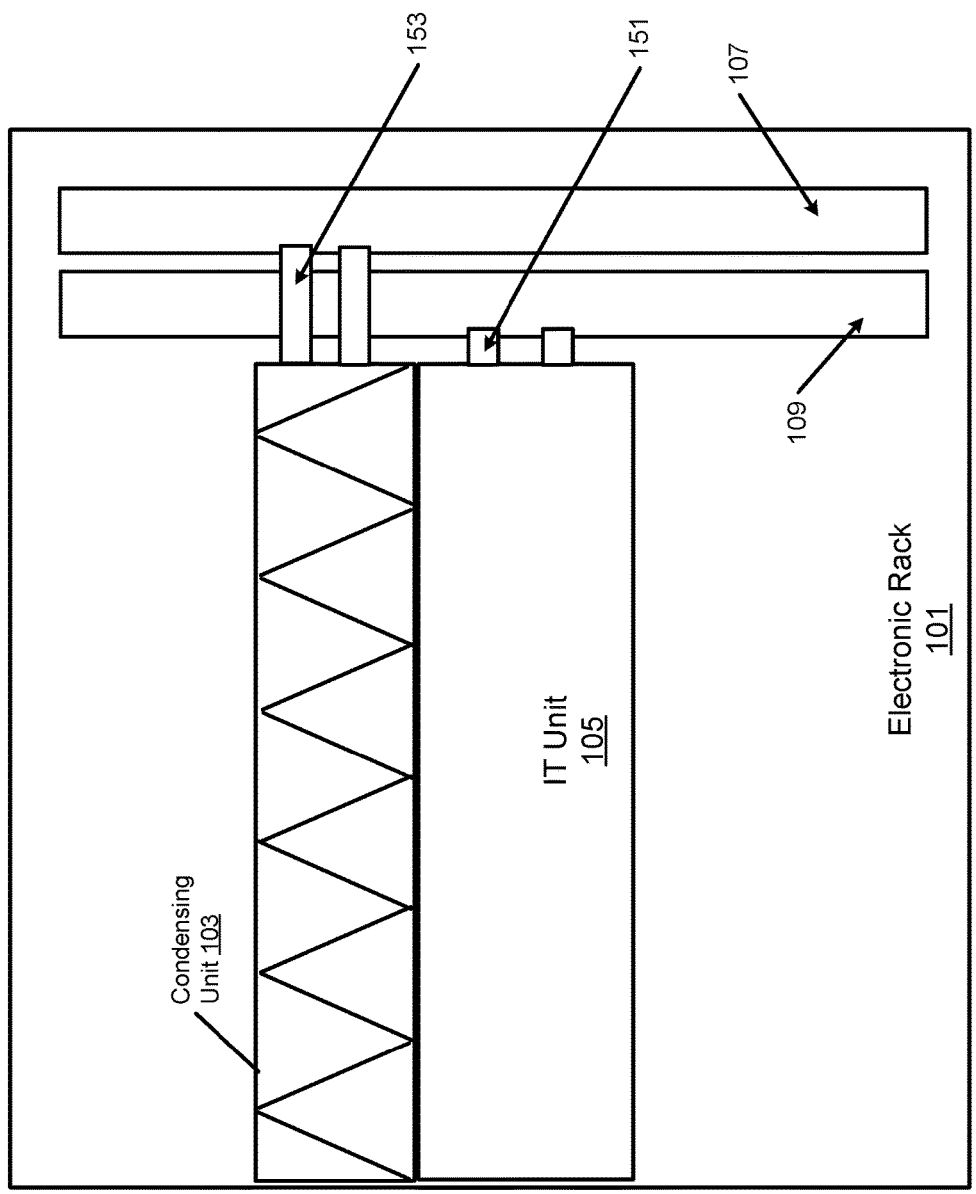
FIG. 1B shows a side view of a rack level system design according to an embodiment of the application.

FIG. 1A shows a front view of a rack level system design 100 according to an embodiment of the application. FIG. 1B shows a side view of a rack level system design 150 according to an embodiment of the application. In particular, FIG. 1A shows a front view of an electronic rack 101. FIG. 1B shows a side view of an electronic rack 150. In other words, FIGS. 1A-1B show the design concept introduced in the present application, and it can be seen that one set of the subsystem is presented. In an embodiment, the condensing unit 103 is populated on top of the IT unit 105. Although only a single pair of condensing unit 103 and IT unit 105 is shown, however, multiple pairs of condensing unit 103 and IT unit 105 can be mounted within electronic rack 101. In an embodiment, a cooling condensing core 111 is used in the condensing unit 103. In an embodiment, the condensing unit 103 is connected to the cooling fluid source, both supply manifold 107a and return manifold 107b (collectively referred to as a rack manifold 107) to recirculate cooling fluid which is used for operating the condensing core 111. The rack manifold 107 includes an array of pairs of fluid connectors (e.g., blind mate connectors) that can be used to connect with the corresponding connectors of condensing units to distribute the cooling fluids to the condensing units mounted at different positions in the electronic rack.

Further, the IT unit 105 is mounted on the bottom of the condensing unit 103 on the rack 101 according to an embodiment. For example, the IT unit 105 is connected to the two-phase distribution source, both the supply manifold 109a and return manifold 109b (collectively referred to as rack manifold 109). Similarly, rack manifold 109 includes an array of pairs of manifold connectors that can be used to connect with corresponding pairs of server connectors of IT units to distribute two-phase cooling fluid to the IT units mounted at different positions in the electronic rack. In an embodiment, the supply manifold 109a is used for filling two-phase coolant before operating the IT and the return manifold 109b is used for draining out the fluid from the IT unit 105 after the use of the server or during maintenance service and so on. Therefore, the key of the two phase distribution source is it is controlled (e.g., filling or draining) and operated (e.g., extracting heat and transitioning between a liquid form and a vapor form) in asynchronous manner all the time according to an embodiment of the application.

Furthermore, the side view of FIG. 1B shows that the interface or connection (151, 153) is designed between the condensing unit 103 and the cooling fluid source, and between the IT unit 105 and the two-phase distribution source according to an embodiment of the application. For example, the single-phase interface or connection 151 is designed between the condensing unit 103 and the cooling fluid source to circulate single-phase fluid. In an embodiment, the two-phase interface or connection 153 is designed between the IT unit 105 and the two-phase distribution source to circulate two-phase cooling fluid. In an embodiment, both the connections 153 and 151 are designed with blind mating connectors.

In an embodiment, an electronic rack 101 includes a condensing unit 103 to be coupled to a first distribution manifold 107, i.e., single-phase cooling fluid. For example, the first distribution manifold 107 includes a first supply manifold 107a and a first return manifold 107b to circulate single-phase cooling fluid received from a first cooling fluid source. In an embodiment, the second distribution manifold 109 includes a second supply manifold 109a and a second return manifold 109b to receive and return the two-phase cooling fluid from the second cooling fluid source, where the two-phase cooling fluid is supplied to a container of IT unit 105.

The electronic rack 101 further includes a server chassis/IT unit 105 positioned underneath the condensing unit 103. In an embodiment, the server chassis unit 105 is coupled to a second distribution manifold 109 to receive two-phase cooling fluid from a second cooling fluid source to fill a container of IT unit 105. IT unit 105 is configured to contain one or more servers or server blades (not shown), which may be at least partially submerged into the two-phase cooling fluid. Each server may include electronic devices, such as, for example, processors, memory, and/or storage devices, which when operate, generate heat.

In an embodiment, the condensing unit 103 is connected with the first distribution manifold 107 via a pair of connectors 153 to receive and to return the single-phase cooling fluid from and to the first cooling fluid source, wherein the first cooling fluid source is a single-phase distribution source.

In an embodiment, the condensing unit 103 is only connected to the first cooling fluid source (e.g., 107a, 107b). In an embodiment, the server chassis unit 105 is coupled to a second cooling fluid (e.g., 109a, 109b), and the second cooling fluid source is a two-phase distribution source.

Further, in an embodiment, the server chassis unit 105 is connected with the second distribution manifold (e.g., 109a, 109b) via a pair of two-phase connectors 151 to receive and to return the two-phase cooling fluid from and to the second cooling fluid source.

In an embodiment, the server chassis unit 105 and the condensing unit 103 are configured to form a sealed region or an integrated unit.

In an embodiment, the server chassis unit 105 is continuously operated when the condensing unit 103 is removed, and the two phase coolant supply constantly delivers fluid to the server 105. The condensing unit 103 is configured to be able to populate and depopulate from the electronic rack 101. The server chassis unit 105 is configured to be able to populate and depopulate from the electronic rack 101.

Figure 2:
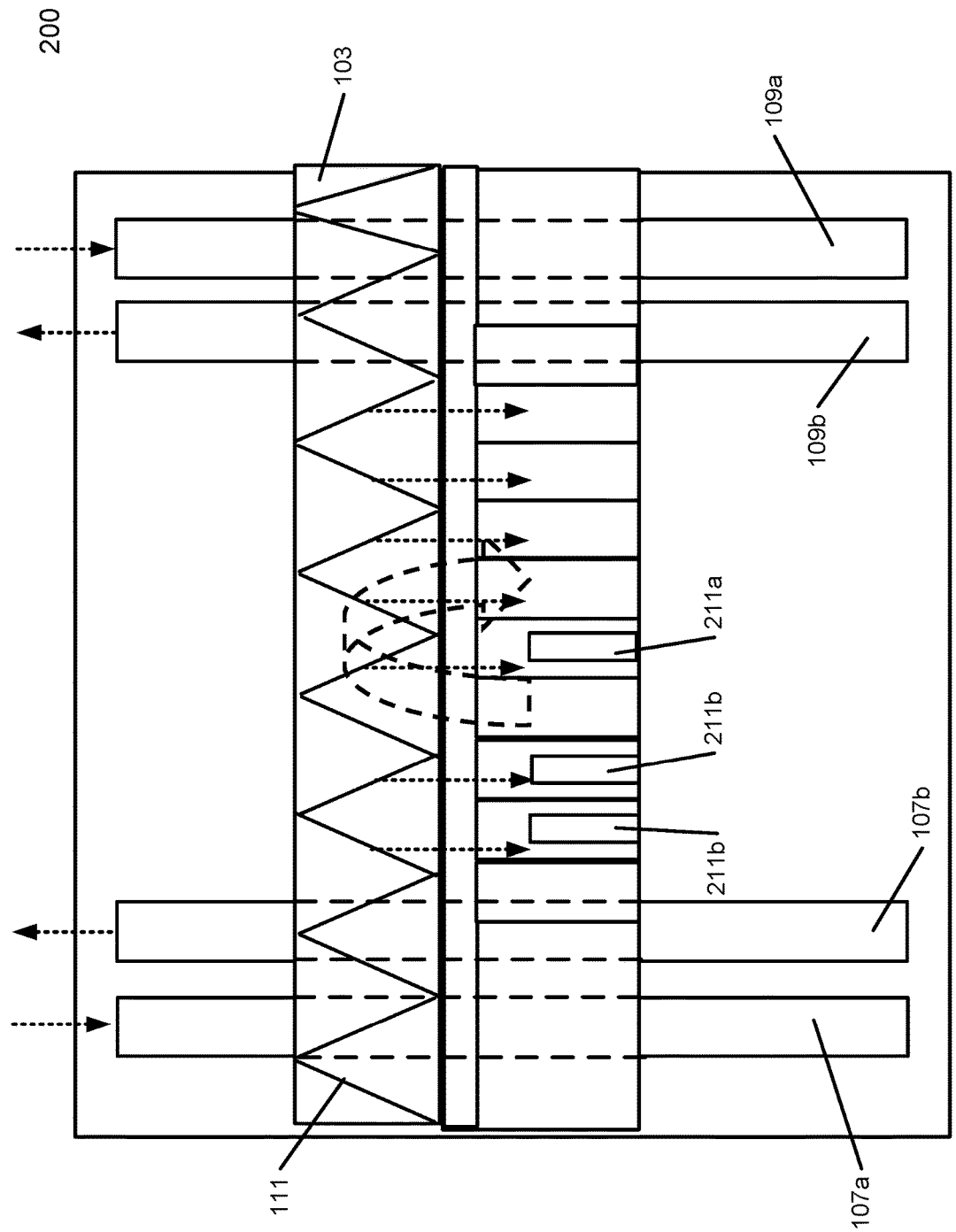
FIG. 2 shows an example system function principle according to certain embodiments of the application.

FIG. 2 shows an example system function principle 200 according to certain embodiments of the application. For example, FIG. 2 shows the system function principle that the IT unit 105 and the condensing unit 103 is designed to form a sealed region and then the IT unit 105 will be filled with two-phase coolant by via supply manifold 109a. In an embodiment, the return path via return manifold 109b does not operate during normal operations. The return path is activated when there is a need to drain the two-phase cooling fluid from IT unit 105 such as maintenance services. The supply and return paths on condensing unit 103 are operating all the time during the normal operations to circulate the single-phase fluid to condense the vapor evaporated from the two-phase fluid of IT unit 105 according to certain embodiments of the application.

In an embodiment, the process of the condensation happened around the condensing core 111 and the vapor is condensed back to the IT unit 105. For example, the heat generated by the electronics is extracted by the two-phase coolant causing the vapor generation.

In an embodiment, the server chassis unit is to contain one or more electronic devices (e.g., 211a, 211b, 211c) that are at least partially submerged in the two-phase cooling fluid within the server chassis unit. In an embodiment, the two-phase cooling fluid is to extract heat from the electronic devices (e.g., 211a, 211b, 211c) and to evaporate into vapor upwardly into the condensing unit 103, and the condensing unit 103 is to condense the vapor into a fluid form and to return the two-phase cooling fluid downwardly back into the server chassis unit.

In an embodiment, the first distribution manifold 107 includes a first supply manifold 107a and a first return manifold 107b configured to receive and return the single-phase cooling fluid from the first cooling fluid source.

In an embodiment, the electronic rack includes one or more servers (e.g., 211a, 211b, 211c) and one or more condensing units. For example, each condensing unit includes one or more cooling coils 111, wherein the single-phase cooling fluid is flowing through the plurality of cooling coils 111.

In an embodiment, the condensing unit is packaged in a condensing chassis to form a contained environment wherein the one or more servers (e.g., 211a, 211b, 211c) are populated underneath the condensing chassis. In an embodiment, the condensing chassis includes one or more connectors only connected to the first cooling fluid source 107. In an embodiment, the condensing unit 103 is configured to be able to populate and depopulate from the electronic rack 101.

In an embodiment, the condensing unit 103 is to condense the vapor into the fluid (e.g., 207) form through condensation around the plurality of cooling coils 111. The second distribution manifold includes a second supply manifold 109a and a second return manifold 109b to receive and return the two-phase cooling fluid from the second cooling fluid source.

Figure 3:
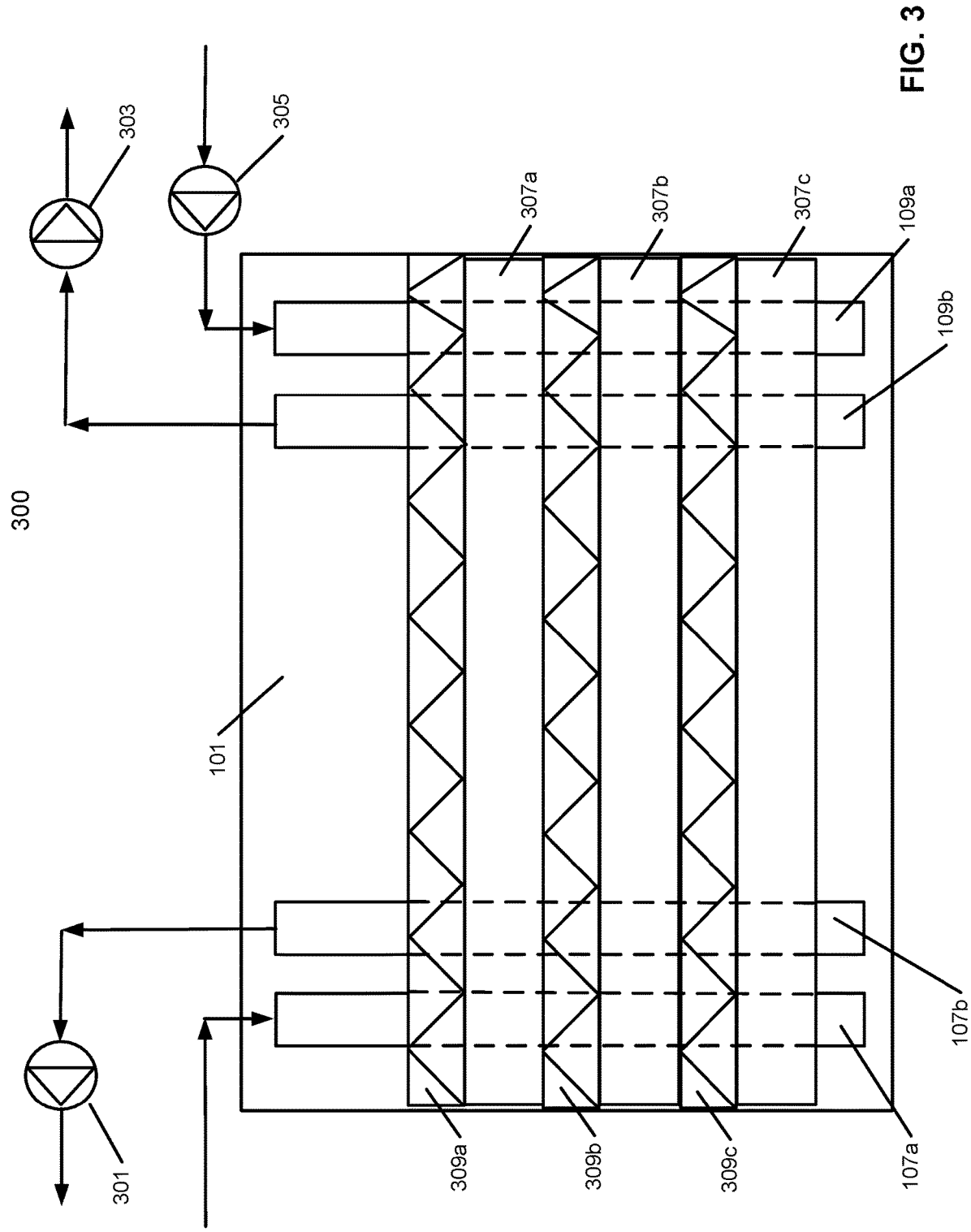
FIG. 3 shows an example fluid recirculation loops according to an embodiment of the application.

FIG. 3 shows an example pumping system 300 according to an embodiment of the application. For example, FIG. 3 shows the pumping system 300 designed for the rack 101. In an embodiment, the recirculation pump 301 is used for moving the cooling fluid, and this process should be operating all the time. In an embodiment, the charging pump 305 is designed for initial charging of the two-phase coolant to the IT unit (e.g., 307a, 307b, 307c). Further, the draining pump 303 used on the two-phase return loop is used for pumping out the fluid from IT unit (e.g., 307a, 307b, 307c). It should be noted that the IT unit and the server are interchangeable terms in the present application.

In an embodiment, the first supply manifold 107a is connected to a circulation pump 301 configured to pump the single-phase cooling fluid from the first cooling fluid source to the condensing units 309a, 309b, 309c. In an embodiment, the second supply manifold 109a is connected to a charging pump 305 configured to initially charge of the two-phase cooling fluid from the second cooling fluid source to fill the server chassis unit of the server chassis units 307a, 307b, 307c.

In an embodiment, the second return manifold 109a is connected to a draining pump 303 configured to pump out the two-phase cooling fluid from the server chassis units 307a, 307b, 307c. In an embodiment, the charging pump 305 and the draining pump 303 are configured to operate in an asynchronous manner. In an embodiment, the draining pump 303 can be connected to the bottom of the second return manifold 109b in an embodiment.

In an embodiment, the second return manifold 109b is inactive during normal operations. In an embodiment, wherein the first supply manifold 107a and the first return manifold 107b are active during normal operations.

Figure 4:
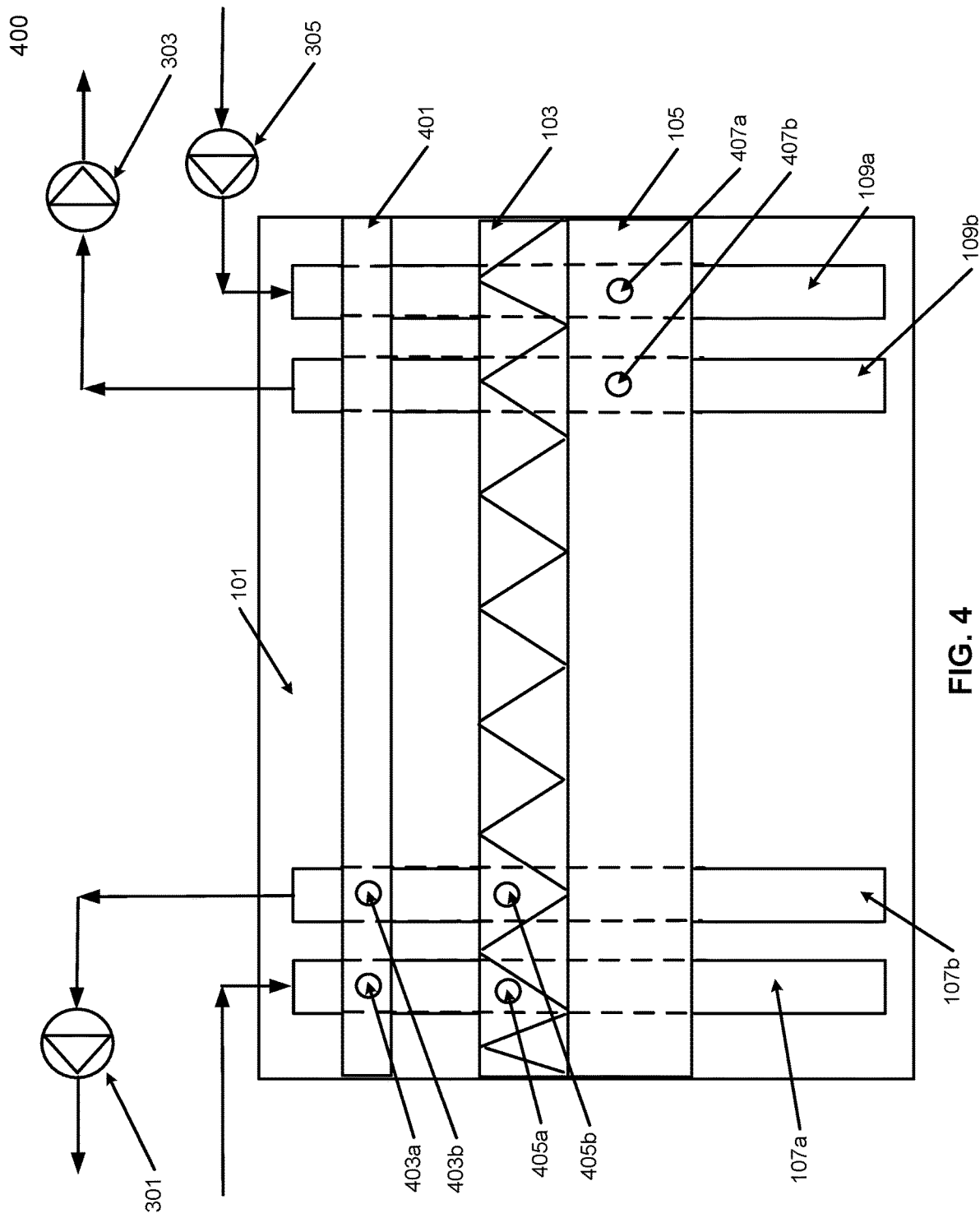
FIG. 4 shows an example rack mixed thermal system according to an embodiment of the application.

FIG. 4 shows an example rack mixed thermal system 400 according to an embodiment of the application. For example, FIG. 4 shows an advanced rack system. In particular, FIG. 4 shows a rack mixed thermal system, and this proposed architecture can be used for populating directly liquid cooling IT as well, which means the system is designed for mix thermal system, according to certain embodiments of the application.

The example in FIG. 4 shows there is a single-phase liquid cooled switch 401 on top of the rack 101, and it can be seen that the connection ports (403a, 403b) are used for the switch, the supply 107a, and return 107b associated with the condensing unit 103 according to an embodiment of the application. For example, the IT unit 105 is connected to the two-phase supply 109a and return 109b.

In an embodiment, server 401 can be understood as a cold plate based single-phase liquid cooling server, which means the existing cooling system allows different cooling method based servers coexisting and operating on a same rack.

In an embodiment, the server which is cold plate single-phase liquid cooling server includes connectors (e.g., 403a, 403b) to connect with the first manifolds (e.g., 107a, 107b). In an embodiment, the condensing chassis 103 includes connectors (e.g., 405a, 405b) to connect with the first manifolds (e.g., 107a, 107b). In an embodiment, the server chassis 105 includes connectors (e.g., 407a, 407b) to connect with the second manifolds (e.g., 109a, 109b).

Figure 5:
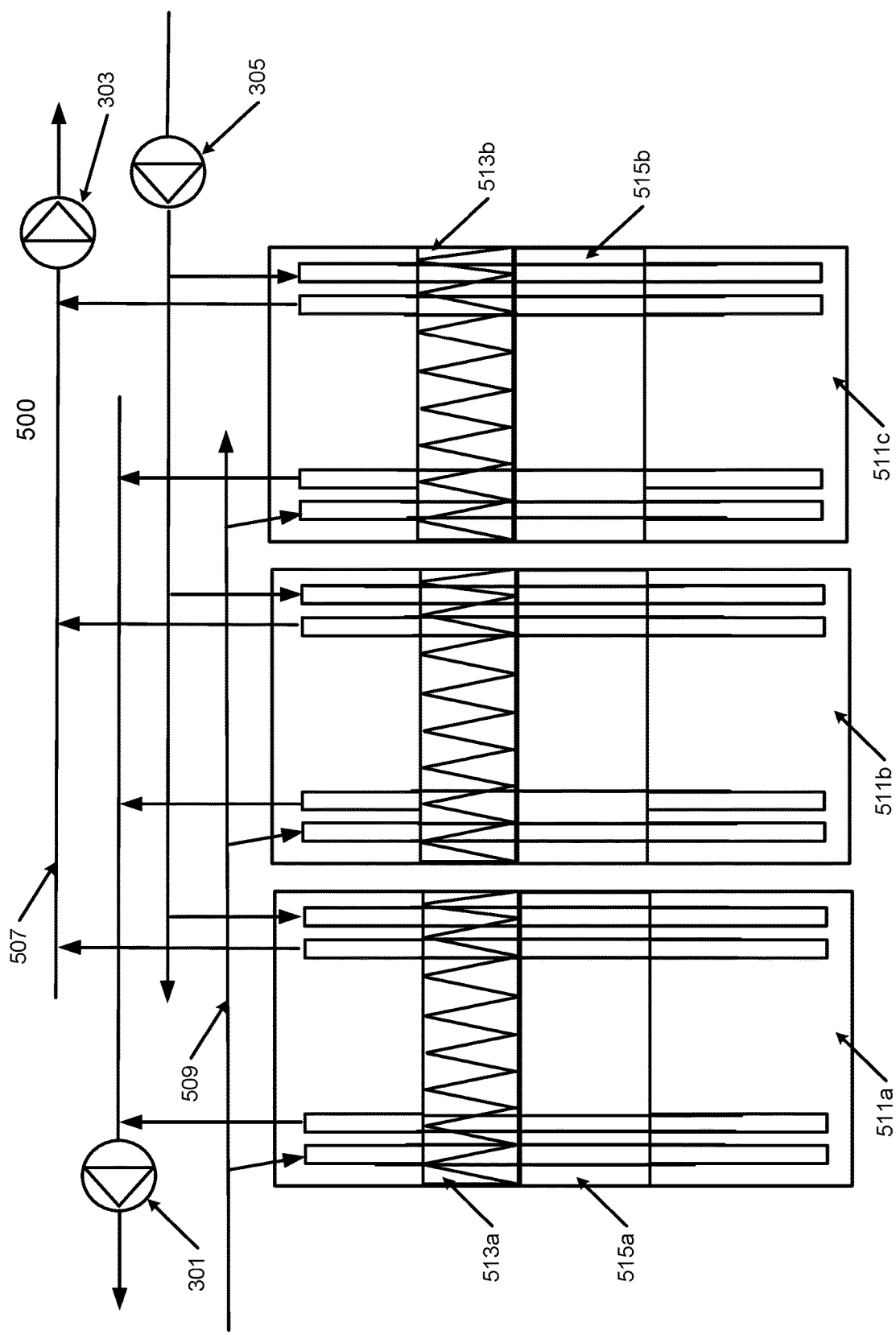
FIG. 5 shows an example cluster design according to an embodiment of the application.

FIG. 5 an example cluster design 500 according to an embodiment of the application. In particular, FIG. 5 a cluster level design 500 of the solution. For example, the two systems including the coolant system 509 and the two-phase coolant system 507 are separated designed and operated for the racks 511a, 511b, 511c.

One feature in FIG. 5 shows that both the condensing unit (e.g., 513a, 513b) as well as the IT unit (e.g., 515a, 515b) can be different to accommodate different use cases and both two units (513, 515) can be a module which can be easily populated and depopulated from the rack (e.g., 511a, 511c), and the corresponding design can be correlated to each other according to certain embodiments of the application.

In an embodiment, the condensing unit (e.g., 513a, 513b) is configured to be able to populate and depopulate from the electronic rack 101. In an embodiment, the server chassis unit (e.g., 515a, 515b) is configured to be able to populate and depopulate from the electronic rack 101. In an embodiment, the fluid control valve may be used on either each rack to achieve rack level two-phase fluid filling and dumping in combination with charging pump 305 and draining pump 303, respectively.

Figure 6:
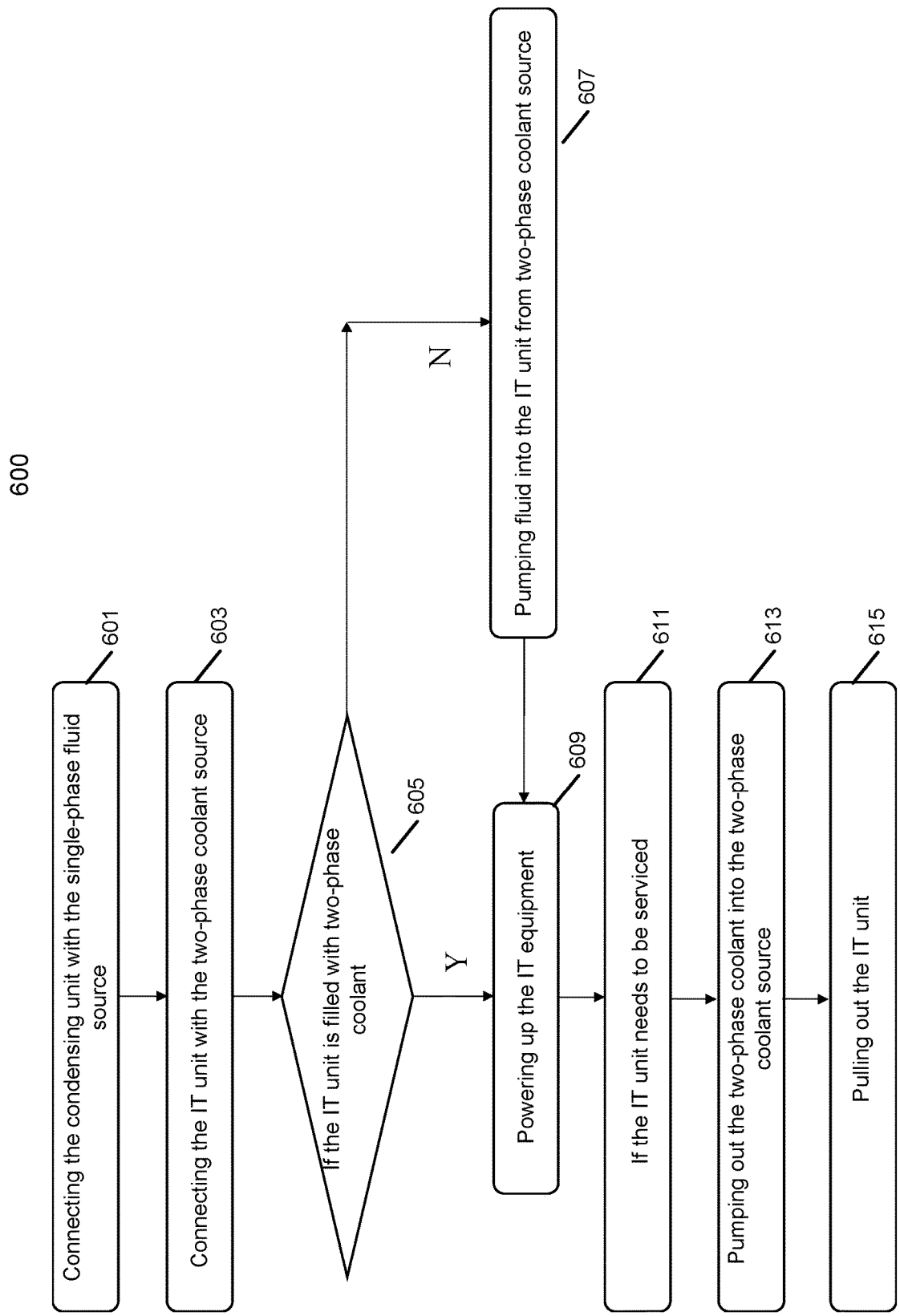
FIG. 6 shows an example system operation flow chart according to an embodiment of the application.

FIG. 6 shows an example system operation flow chart 600 according to an embodiment of the application. In particular, FIG. 6 shows the solution operation flow chart 600, and the key is that the two-phase coolant is firstly pumped to fill the IT unit 105 before the IT unit 105 is completely powered up and being operated. In addition, in an embodiment, the fluid is pumped out before depopulated from the rack (e.g., 101), and the key features here are the different design and operation of the two systems.

In an embodiment, at operation 601, the condensing unit (e.g., 103) is connected with the single-phase fluid source (e.g. 107a, 107b). In an embodiment, at operation 603, the IT unit (e.g., 105) is connected with the two-phase coolant source (e.g., 109a, 109b). In an embodiment, at operation 605, if the IT unit 105 is filled with two-phase coolant, then at operation 609, the system will power up IT equipment in the IT unit 105. In an embodiment, at operation 605, if the IT unit 105 is not yet filled with two-phase coolant, then at operation 607, the system will pump fluid into the IT unit 105 from the two-phase coolant source by the charging pumper 305. In an embodiment, at operation 611, if the IT unit needs to be serviced, then at operation 613, the system will pump out the two-phase coolant back to the two-phase coolant source by the draining pumper 303. Then at operation 615, the IT unit 105 can be pulled out.

Figure 7:
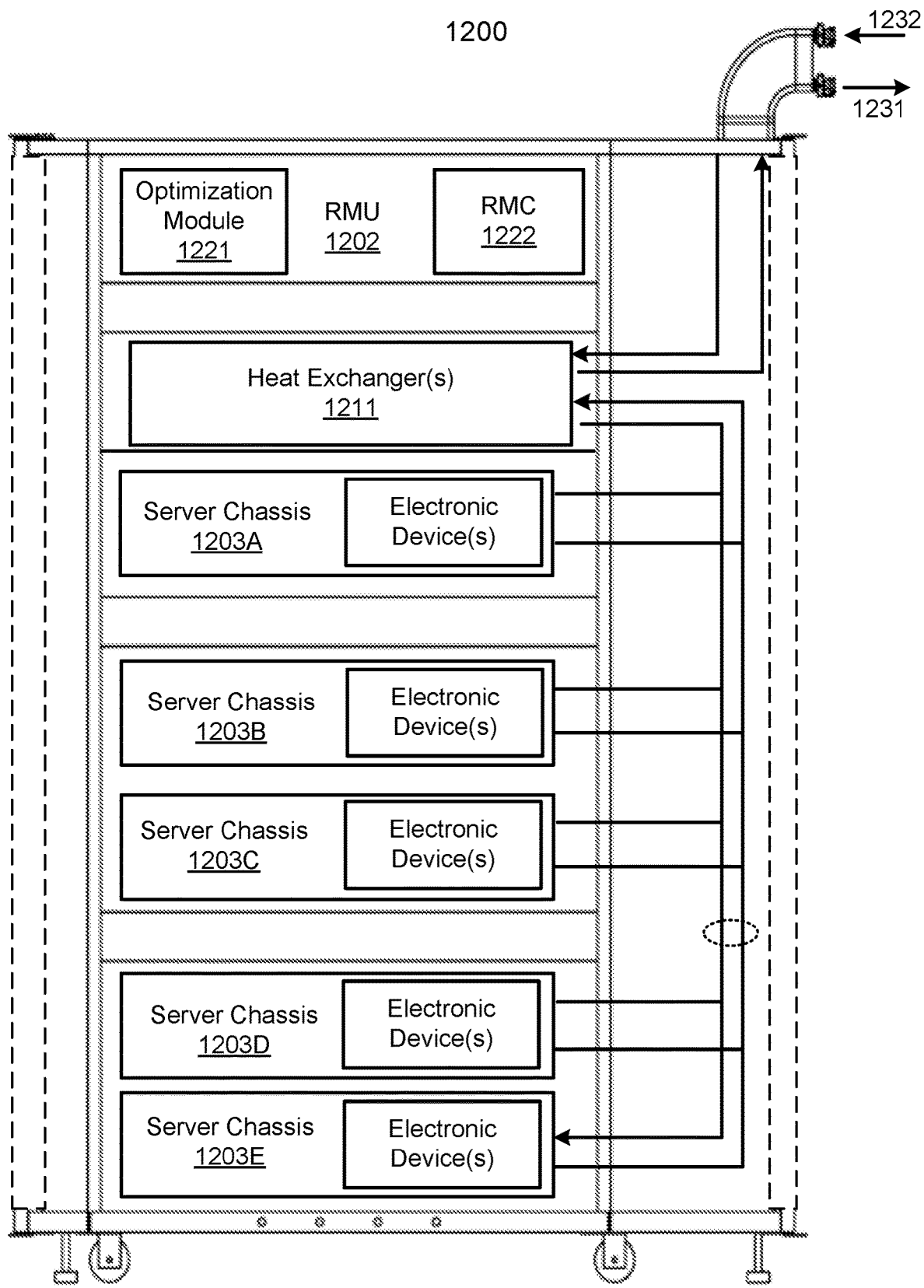
FIG. 7 is a block diagram illustrating an example of an electronic rack according to one embodiment.

FIG. 7 is block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backend of server chassis 1203 or on the electronic rack to generate airflows flowing from frontend 1204, traveling through the air space of the server chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to heat exchanger 1211. Note that heat exchanger 1211 can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cold plate. The cold plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the server chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
a condensing unit to be coupled to a first distribution manifold to circulate single-phase cooling fluid received from a first cooling fluid source; and
a server chassis unit positioned underneath the condensing unit, wherein the server chassis unit is coupled to a second distribution manifold to receive two-phase cooling fluid from a second cooling fluid source to fill the server chassis unit,
wherein the server chassis unit is to contain one or more electronic devices that are at least partially submerged in the two-phase cooling fluid within the server chassis unit, wherein the two-phase cooling fluid is to extract heat from the electronic devices and to evaporate into vapor upwardly into the condensing unit, and wherein the condensing unit is to condense the vapor into a fluid phase and to return the fluid downwardly back into the server chassis unit.

2. The electronic rack of claim 1, wherein the condensing unit is connected with the first single-phase distribution manifold via a pair of connectors to receive and to return the single-phase cooling fluid from and to the first cooling fluid source, wherein the first cooling fluid source is a single-phase distribution source.

3. The electronic rack of claim 1, wherein the first distribution manifold includes a first supply manifold and a first return manifold configured to receive and return the single-phase cooling fluid from the first cooling fluid source, and wherein the second distribution manifold includes a second supply manifold and a second return manifold to receive and return the two-phase cooling fluid from the second cooling fluid source.

4. The electronic rack of claim 3, wherein the first supply manifold is connected to a circulation pump configured to pump the single-phase cooling fluid from the first cooling fluid source to the condensing unit.

5. The electronic rack of claim 3, wherein the second return manifold is inactive during normal operations.

6. The electronic rack of claim 3, wherein the second supply manifold is connected to a charging pump configured to initially charge of the two-phase cooling fluid from the second two-phase cooling fluid source to fill the server chassis unit.

7. The electronic rack of claim 6, wherein the second return manifold is connected to a draining pump configured to pump out the two-phase cooling fluid from the server chassis unit.

8. The electronic rack of claim 7, wherein the charging pump and the draining pump are configured to operate in an asynchronous manner.

9. The electronic rack of claim 1, wherein the condensing unit includes one or more cooling coils, wherein the single-phase cooling fluid is flowing through the one or more cooling coils, and being contained within the one or more cooling coils.

10. The electronic rack of claim 9, wherein the condensing unit is packaged in a condensing chassis to form a contained environment once the condensing chassis is installed underneath where one or more servers are populated.

11. The electronic rack of claim 10, wherein the condensing chassis includes one or more connectors connected to the first cooling fluid source.

12. The electronic rack of claim 1, wherein the server chassis unit is coupled to a second cooling fluid, and wherein the second cooling fluid source is a two-phase distribution source.

13. The electronic rack of claim 1, wherein the server chassis unit is connected with the second two-phase distribution manifold via a pair of connectors to receive and to return the two-phase cooling fluid from and to the second cooling fluid source.

14. The electronic rack of claim 1, wherein the server chassis unit and the condensing unit are configured to form a sealed region.

15. A data center cooling system, comprising:
a fluid supply line coupled to receive cooling fluid from a cooling fluid source;
a fluid return line coupled to return the cooling fluid to the cooling fluid source;
a plurality of electronic racks coupled to the fluid supply line and the fluid return line, wherein each of the electronic racks comprises:
a condensing unit to be coupled to a first distribution manifold to circulate single-phase cooling fluid received from a first cooling fluid source; and
a server chassis unit positioned underneath the condensing unit, wherein the server chassis unit is coupled to a second distribution manifold to receive two-phase cooling fluid from a second two-phase cooling fluid source to fill the server chassis unit,
wherein the server chassis unit is to contain one or more electronic devices that are at least partially submerged in the two-phase cooling fluid within the server chassis unit, wherein the two-phase cooling fluid is to extract heat from the electronic devices and to evaporate into vapor upwardly into the condensing unit, and wherein the condensing unit is to condense the vapor into a fluid phase and to return the two-phase cooling fluid downwardly back into the server chassis unit.

16. The cooling system of claim 15, wherein the condensing unit is connected with the first single-phase distribution manifold via a pair of connectors to receive and to return the single-phase cooling fluid from and to the first cooling fluid source, wherein the first cooling fluid source is a single-phase distribution source.

17. The cooling system of claim 15, wherein the first distribution manifold includes a first supply manifold and a first return manifold configured to receive and return the single-phase cooling fluid from the first cooling fluid source, and wherein the second distribution manifold includes a second supply manifold and a second return manifold to receive and return the two-phase cooling fluid from the second cooling fluid source.

18. The cooling system of claim 17, wherein the first supply manifold is connected to a circulation pump configured to pump the single-phase cooling fluid from the first cooling fluid source to the condensing unit.

19. The cooling system of claim 17, wherein the second return manifold is inactive during normal operations.

20. A server cooling design, comprising:
a server chassis unit positioned underneath a condensing unit to be coupled to a first distribution manifold to circulate single-phase cooling fluid received from a first cooling fluid source, wherein the server chassis unit is coupled to a second distribution manifold to receive two-phase cooling fluid from a second two-phase cooling fluid source to fill the server chassis unit, wherein one or more connectors are on the server chassis unit to connect with the second distribution manifold,
wherein the server chassis unit is to contain one or more electronic devices that are at least partially submerged in the two-phase cooling fluid within the server chassis unit, wherein the two-phase cooling fluid is to extract heat from the electronic devices and to evaporate into vapor upwardly into the condensing unit, and wherein the condensing unit is to condense the vapor into a fluid phase and to return the fluid downwardly back into the server chassis unit.

* * * * *